(12) United States Patent
Haouaneb et al.

(10) Patent No.: US 12,726,105 B2
(45) Date of Patent: Sep. 1, 2026

(54) EMC HARDWARE FILTER FOR A FLEET MANAGEMENT APPARATUS

(71) Applicant: Carrier Corporation, Palm Beach Gardens, FL (US)

(72) Inventors: Hamdi Haouaneb, Franqueville Saint Pierre (FR); Jamal Zarrabi, Franqueville Saint Pierre (FR)

(73) Assignee: CARRIER CORPORATION, Palm Beach Gardens, FL (US)

( * ) Notice: Subject to any disclaimer, the term of this patent is extended or adjusted under 35 U.S.C. 154(b) by 188 days.

(21) Appl. No.: 18/638,913

(22) Filed: Apr. 18, 2024

(65) Prior Publication Data

US 2024/0356533 A1 Oct. 24, 2024

Related U.S. Application Data

(60) Provisional application No. 63/497,553, filed on Apr. 21, 2023.

(51) Int. Cl.
*H02M 1/12* (2006.01)
*H03H 1/00* (2006.01)
(Continued)

(52) U.S. Cl.
CPC ........... *H02M 1/123* (2021.05); *H02M 1/126* (2013.01); *H03H 1/0007* (2013.01);
(Continued)

(58) Field of Classification Search
CPC ........ H02M 1/123; H02M 1/126; H02M 1/44; H03H 1/0007; H03H 7/0115;
(Continued)

(56) References Cited

U.S. PATENT DOCUMENTS 5,969,583 A 10/1999 Hutchison
7,667,988 B2 2/2010 Haeberle et al.
2010/0303263 A1 12/2010 Hiensch

FOREIGN PATENT DOCUMENTS

KR 20200102785 A * 9/2020 ............... H03H 1/00

OTHER PUBLICATIONS

Extended European Search Report received for EP Application No. 24171430.2, mailed on Oct. 9, 2024, 7 Pages.

(Continued)

*Primary Examiner* — Daniel Cavallari
(74) *Attorney, Agent, or Firm* — Souad Hakim

(57) ABSTRACT

Provided is an EMC filter for rejecting external EMC noises and filtering self-generated emission radiations. The EMC filter includes a first connection port configured to receive one or more input signals from a plurality of sensors and an input power signal. The EMC filter further includes a first filter stage, a second filter stage, and a third filter stage. The first filter stage is configured to filter the received input power signal and the second filter stage is configured to filter one or more ground output signals of the EMC filter. The third filter stage is configured to filter the received one or more input signals to remove EMC noises from the received one or more input signals. The EMC filter further includes a second connection port configured to output the filtered one or more input signals and the filtered input power signal to a fleet management apparatus.

11 Claims, 4 Drawing Sheets

(51) Int. Cl.
*H03H 7/01* (2006.01)
*B60P 3/20* (2006.01)

(52) U.S. Cl.
CPC .............. *H03H 7/0115* (2013.01); *B60P 3/20* (2013.01); *H03H 2001/0057* (2013.01)

(58) Field of Classification Search
CPC .............. H03H 2001/0057; B60P 3/20; B60H 1/00364; B60H 1/3205; F25D 29/00
See application file for complete search history.

(56) References Cited

OTHER PUBLICATIONS

Joseph Carr, "Introduction to the EMI Problem" The Technician's EMI Handbook, vol. 1, Jun. 15, 2000, pp. 1-247, XP040426033, Figure 6.9, Elsevier B.V., n.d.

* cited by examiner

EMC HARDWARE FILTER FOR A FLEET MANAGEMENT APPARATUS

CROSS REFERENCE TO RELATED APPLICATION

This application claims the benefit of U.S. Provisional Patent Application No. 63/497,553 filed on Apr. 21, 2023, which is incorporated by reference herein in its entirety.

FIELD OF THE INVENTION

The disclosure relates to the field of electro-mechanical control systems. In particular, the disclosure relates to an electromagnetic compatibility (EMC) filter to reduce electromagnetic interference (EMI) generated by one or more electronic equipment in an electro-mechanical control system.

BACKGROUND

In recent years, fleet management systems have been designed to help businesses manage their vehicle fleets more efficiently. The fleet management systems can track or manage a fleet of vehicles including refrigeration transport vehicles. Each of the fleet management systems includes a fleet module, which helps businesses in optimizing their fleet utilization, reduce operating costs, and improve driver safety.

However, the existing fleet modules have been encountering a number of issues that have resulted in such modules being non-compliant with the EN12830 standard. The EN12830 standard provides a set of technical requirements for temperature monitoring devices for ensuring the safety and quality of temperature-sensitive products during transport, storage, and distribution. One of the major problems of being non-compliant with the EN12830 standard is the fleet modules' EMC compatibility, namely the ability to reliably pass tests associated with Electromagnetic Compatibility (EMC) standards such as EN61000-4-3, EN61000-4-6, and EN61000-4-8. This can lead to a number of issues, including disruption of electronic boards of the fleet modules in the vicinity due to conductive emission issues. Additionally, the fleet modules may also lose communication due to external EMC noise. The above-mentioned problems may affect the fleet modules reliability. Also, the above-mentioned problems pose a challenge as the fleet modules may not be able to be marketed without passing the aforementioned tests associated with the EMC standards and associated reliability issues.

Therefore, the problems associated with the EMC compatibility of the fleet modules need to be addressed in order to make the fleet modules compliant with the EN12830 standard.

SUMMARY

This summary is provided to introduce a selection of concepts in a simplified format that is further described in the detailed description of the invention. This summary is not intended to identify key or essential inventive concepts of the invention, nor is it intended for determining the scope of the invention.

Disclosed herein is an electromagnetic compatibility (EMC) filter that includes a first connection port configured to receive one or more input signals from a plurality of sensors and an input power signal. The EMC filter further includes a first filter stage, a second filter stage, and a third filter stage including a plurality of ferrite beads and a plurality of capacitors. The first filter stage is configured to filter the received input power signal and the second filter stage is configured to filter one or more ground output signals of the EMC filter. The third filter stage is configured to filter the received one or more input signals to remove EMC noises from the received one or more input signals. Furthermore, the EMC filter further includes a second connection port configured to output the filtered one or more input signals and the filtered input power signal to a fleet management apparatus.

In one or more embodiments, each of the first filter stage and the second filter stage is configured in a common mode inductance configuration.

In one or more embodiments, an inductance value of each of the first filter stage and the second filter stage in the common mode inductance configuration is 51 μH with a tolerance of +/−30% at a frequency of 1 Khz.

In one or more embodiments, the received one or more input signals include at least controller area network (CAN) signals, output signals of one or more temperature sensors, a plurality of digital signals, power supply voltage or current signals associated with the one or more temperature sensors, and fuel level sensor circuit (FLS-C) signals.

In one or more embodiments, the third filter stage may be further configured to filter the power supply voltage or the current signals using a first ferrite bead of the plurality of ferrite beads and a first capacitor of the plurality of capacitors. A capacitance value of the first capacitor is 68 pF with a tolerance of +/−5%.

In one or more embodiments, the third filter stage may be further configured to filter the output signals of the one or more temperature sensors using a second ferrite bead of the plurality of ferrite beads and a second capacitor of the plurality of capacitors, wherein a capacitance value of the second capacitor is one of 68 pF with the tolerance of +/−5% or 100 nF with a tolerance of +/−10%.

In one or more embodiments, the third filter stage may be further configured to filter the plurality of digital signals using a third ferrite bead of the plurality of ferrite beads and a third capacitor of the plurality of capacitors, wherein a capacitance value of the third capacitor is 100 nF with the tolerance of +/−10%.

In one or more embodiments, the third filter stage may be further configured to filter the FLS-C signals using a fourth ferrite bead of the plurality of ferrite beads and a fourth capacitor of the plurality of capacitors, wherein a capacitance value of the fourth capacitor is 100 nF with the tolerance of +/−10%.

In one or more embodiments, a resistance value of each ferrite bead of the plurality of ferrite beads is 600Ω with a tolerance of +/−25% at a frequency of 100 MHz.

Also, disclosed herein is a fleet management system that includes a refrigeration unit including a plurality of sensors, a fleet management module configured to control setting of the refrigeration unit, and an electromagnetic compatibility (EMC) filter between the refrigeration unit and the fleet management module. The EMC filter includes a first connection port configured to receive one or more input signals from the plurality of sensors and an input power signal. The EMC filter further includes a first filter stage configured to filter the received input power signal and a second filter stage configured to filter one or more ground output signals of the EMC filter. In addition, the EMC filter includes a third filter stage that includes a plurality of ferrite beads and a plurality of capacitors. The third filter stage is configured to filter the received one or more input signals to remove EMC noises from the received one or more input signals. Furthermore, the EMC filter includes a second connection port configured to output the filtered one or more input signals and the filtered input power signal to the fleet management module, wherein the fleet management module is configured to control the setting of the refrigeration unit based on the filtered one or more input signals.

Also, disclosed herein is a refrigerated trailer that includes a refrigeration unit including a plurality of sensors, a fleet management module configured to control setting of the refrigeration unit, and an electromagnetic compatibility (EMC) filter between the refrigeration unit and the fleet management module. The EMC filter includes a first connection port configured to receive one or more input signals from the plurality of sensors and an input power signal. The EMC filter further includes a first filter stage configured to filter the received input power signal and a second filter stage configured to filter one or more ground output signals of the EMC filter. In addition, the EMC filter includes a third filter stage that includes a plurality of ferrite beads and a plurality of capacitors. The third filter stage is configured to filter the received one or more input signals to remove EMC noises from the received one or more input signals. Furthermore, the EMC filter includes a second connection port configured to output the filtered one or more input signals and the filtered input power signal to the fleet management module, wherein the fleet management module is configured to control the setting of the refrigeration unit based on the filtered one or more input signals.

To further clarify the advantages and features of the method and system, a more particular description of the method and system will be rendered by reference to specific embodiments thereof, which are illustrated in the appended drawing. It is appreciated that these drawings depict only typical embodiments of the invention and are therefore not to be considered limiting its scope. The invention will be described and explained with additional specificity and detail with the accompanying drawings.

BRIEF DESCRIPTION OF THE DRAWINGS

These and other features, aspects, and advantages will become better understood when the following detailed description is read with reference to the accompanying drawings in which like characters represent like parts throughout the drawings, wherein.

Figure 1:
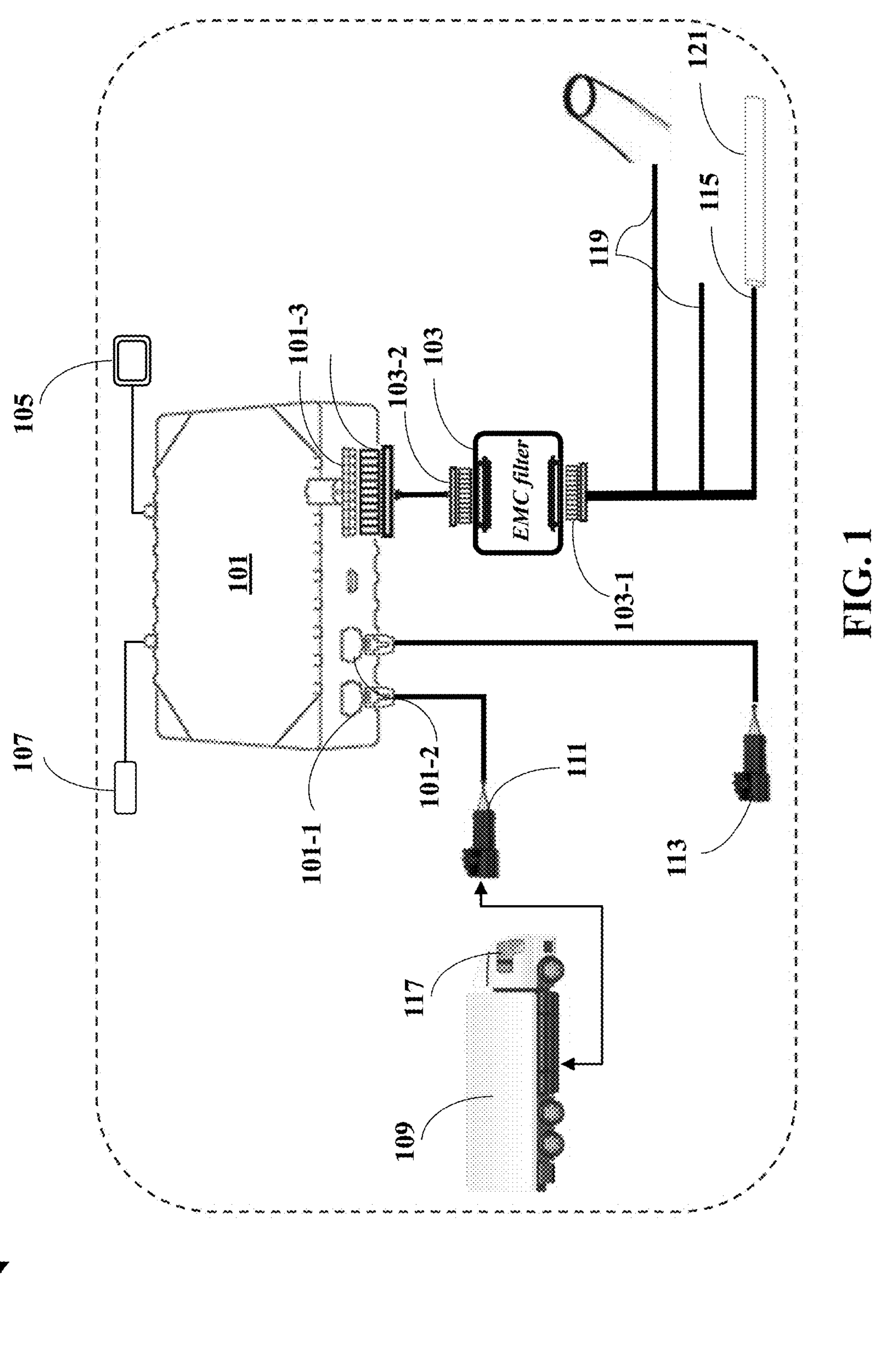
FIG. 1 illustrates an example environment of an electro-mechanical control system.

Further, skilled artisans will appreciate that elements in the drawings are illustrated for simplicity and may not have necessarily been drawn to scale. For example, the flow charts illustrate the method in terms of the most prominent steps involved to help improve understanding of aspects of the invention. Furthermore, in terms of the construction of the device, one or more components of the device may have been represented in the drawings by conventional symbols, and the drawings may show only those specific details that are pertinent to understanding the embodiments of the invention so as not to obscure the drawings with details that will be readily apparent to those of ordinary skill in the art having the benefit of the description herein.

DETAILED DESCRIPTION

It should be understood at the outset that although illustrative implementations of embodiments are illustrated below, the system and method may be implemented using any number of techniques. The disclosure should in no way be limited to the illustrative implementations, drawings, and techniques illustrated below, including the exemplary design and implementation illustrated and described herein, but may be modified within the scope of the appended claims along with their full scope of equivalents.

The term "some" as used herein is defined as "one, or more than one, or all." Accordingly, the terms "one," "one or more," but not all" or "all" would all fall under the definition of "some." The term "some embodiments" may refer to one embodiment or one or more embodiments or all embodiments. Accordingly, the term "some embodiments" is defined as meaning "one embodiment, or more than one embodiment, or all embodiments."

The terminology and structure employed herein are for describing, teaching, and illuminating some embodiments and their specific features and elements and do not limit, restrict, or reduce the spirit and scope of the claims or their equivalents.

More specifically, any terms used herein such as but not limited to "includes", "comprises", "has", "have", and grammatical variants thereof do not specify an exact limitation or restriction and certainly do not exclude the possible addition of one or more features or elements, unless otherwise stated, and must not be taken to exclude the possible removal of one or more of the listed features and elements, unless otherwise stated with the limiting language "must comprise" or "needs to include".

The term "unit" used herein may imply a unit including, for example, one of hardware, software, and firmware or a combination of two or more of them. The "unit" may be interchangeably used with a term such as logic, a logical block, a component, a circuit, and the like. The "unit" may be a minimum system component for performing one or more functions or may be a part thereof.

Unless otherwise defined, all terms, and especially any technical and/or scientific terms, used herein may be taken to have the same meaning as commonly understood by one having ordinary skill in the art.

Embodiments will be described below in detail with reference to the accompanying drawings.

FIG. 1 illustrates an example system environment 100 of an electro-mechanical control system. The system environment 100 includes a fleet management apparatus 101, an electromagnetic compatibility (EMC) filter 103, a global navigation satellite system (GNSS) antenna 105, and a global system for mobile communications (GSM) antenna 107 connected to the fleet management apparatus 101, a refrigeration trailer 109 comprising a refrigeration unit attached to a truck 117-, a controller area network (CAN) bus 111 connected to a first input port 101-1 of the fleet management apparatus 101, and a telematics antenna 113 connected to a second input port 101-2 of the fleet management apparatus 101. The refrigeration trailer 109 may be pulled by the truck 117 in order to transport perishable goods optionally in combination with non-perishable goods from one location to another location. While reference is made to a refrigerated trailer comprising a refrigeration unit it should be understood that this terminology is intended to include situations in which a refrigeration unit is associated with the cargo portion of a truck or van such as in a light commercial vehicle (sometimes referred to as a box truck). In these situations, the refrigerated cargo space is equivalent to the refrigerated trailer as used herein.

The refrigeration unit disposed on the refrigeration trailers 109 is connected to the fleet management apparatus 101 via the CAN bus 111 (as shown in FIG. 1), the telematics antenna 113, or a combination thereof. The refrigeration unit provides a conditioned environment to the interior of the refrigerated trailer 109.

The EMC filter 103 includes a first connection port 103-1 and a second connection port 103-2. The first connection port 103-1 of the EMC filter 103 may be configured to receive one or more input signals 119 from the plurality of sensors and an input power signal 115 from the power supply line 121 powering the fleet management apparatus 101. The second connection port 103-2 of the EMC filter 103 is connected to a third input port 101-3 of the fleet management apparatus 101.

The fleet management apparatus 101 is configured to communicate with various components and the plurality of sensors that are installed in the refrigeration trailer 109 (as part of the refrigeration unit) via the CAN bus 111 and/or the telematics antenna 113. The fleet management apparatus 101 may be configured to receive sensor inputs from the plurality of sensors installed in the refrigeration trailer 109. The fleet management apparatus 101 may also be configured to monitor, manage, and control cooling parameters or setting of the refrigeration unit based on the received sensor inputs. The fleet management apparatus 101 may also be referred to as a fleet management module without any deviation from the scope of the disclosure.

In one or more embodiments, the EMC filter 103 is connected between the fleet management apparatus 101 and the refrigeration unit. The EMC filter 103 may also be connected to electronic components (e.g., temperature sensors, fuel sensors, etc.) associated with the refrigeration unit. The EMC filter 103 is configured to filter electromagnetic interference (EMI) from one or more input signals 119 from a plurality of sensors (not shown in FIG. 1) and input power signals received from a power supply line 121 powering the fleet management apparatus 101. The filtering operation of the EMC filter 103 to filter the EMI ensures that the electrical system of the refrigerated trailer 109 including a temperature control system, control modules, and sensors that monitor and regulate the operation of the refrigerated trailer 109, may be operated correctly. The EMC filter 103 is configured to filter out any unwanted external EMC noises that may be present in the system environment 100 and self-generated emission radiation. The self-generated emission radiation may be radiation generated by the EMC filter 103. Further, the first connection port 103-1 of the EMC filter 103 is configured to receive one or more input signals 119 from the plurality of sensors and an input power signal 115 from the power supply line 121 powering the fleet management apparatus 101. The one or more input signals 119 may include, but not limited to, CAN signals, output signals of one or more temperature sensors installed inside the refrigeration trailer 109, a plurality of digital signals, power supply voltage or current signals associated with the one or more temperature sensors, fuel level sensor circuit (FLS-C) signals, state of battery charge signals, and the like. Here, the FLS-C signals correspond to electrical signals generated by a fuel level sensor of a fuel system of refrigeration unit associated with the trailer 109. Accordingly, the fleet management apparatus 101 may control the setting of the refrigeration unit.

The input power signal 115 powering the fleet management apparatus 101 may cause an electrical disturbance to the fleet management apparatus 101. As a non-limiting example, the input power signal 115 may generate voltage spikes, switching transients, and/or electromagnetic radiation. When the electromagnetic radiation propagates through the air the fleet management apparatus 101 may pick up the electromagnetic radiation. The pickup of the electromagnetic radiation by the fleet management apparatus 101 may result in the generation of the EMI. The generated EMI may cause the fleet management apparatus 101 to malfunction or work incorrectly.

The GNSS antenna 105 is configured to receive signals from one or more satellite systems. The GNSS antenna 105 may be designed to receive signals from multiple satellites simultaneously, even in adverse weather conditions. The fleet management apparatus 101 is configured to determine the location, speed, and direction of the trailer 109 based on the received signals from the one or more satellite systems.

The GSM antenna 107 is configured to communicate with a cellular network to provide real-time updates on the refrigeration trailer's location, status, and other information associated with the refrigeration trailer 109. The GSM antenna 105 may be configured to operate reliably in areas with weak cellular signals. The GSM antenna 107 may be connected to a cellular modem or a router, which allows the fleet management apparatus 101 to send and receive data over the cellular network.

The telematics antenna 113 is configured to provide real-time communication between the refrigerated trailer 109 and the fleet management apparatus 101. The real-time communication allows the fleet management apparatus 101 to send and receive data related to the refrigeration trailer's location, status, and other information associated with the with the refrigeration trailer's operation.

The EMC filter 103 may further include a plurality of filtering components in order to reduce the EMI caused due to the electromagnetic radiation propagation and the input power signal 115. In particular, the EMC filter 103 includes a first filter stage 301, a second filter stage 303, and a third filter stage 305 (as shown in FIG. 3) in addition to the first connection port 103-1 and the second connection port 103-2. The first filter stage 301 includes a first common mode inductance filter 200-1 (as shown in FIG. 2A) and the second filter stage 303 includes a second common mode inductance filter 200-2 (as shown in FIG. 2B).

Figures 2A, 2B:
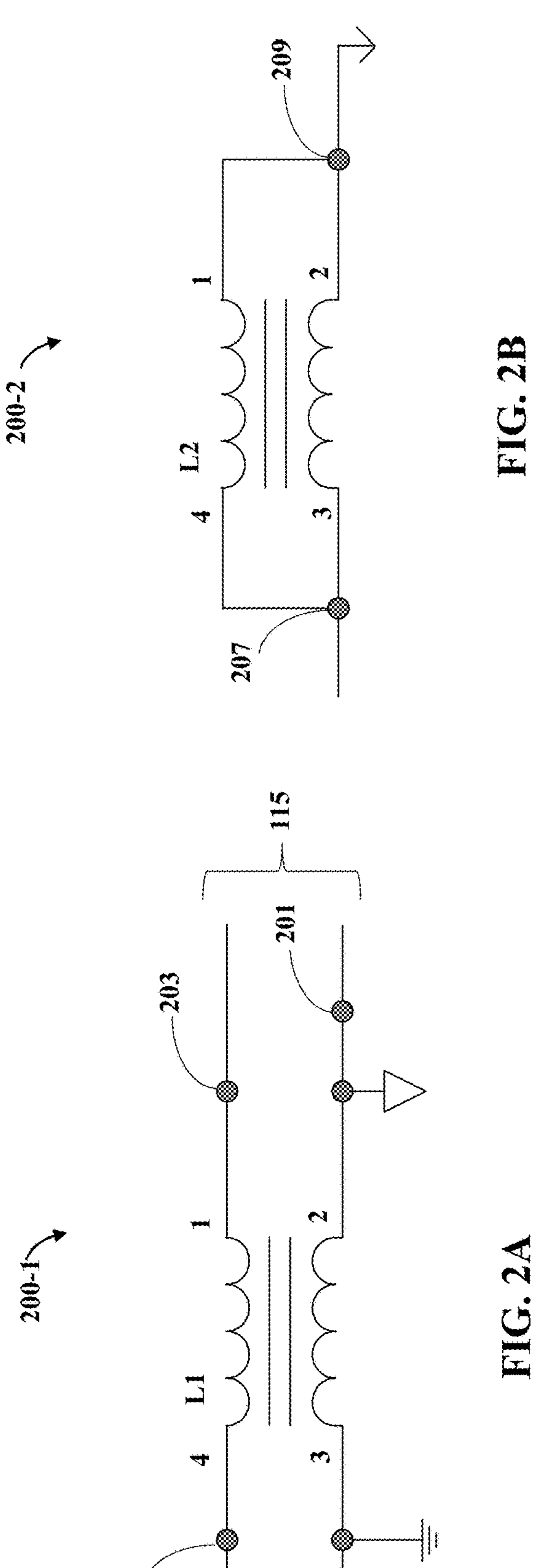
FIG. 2A illustrates a schematic diagram of a first common mode inductance filter for filtering power supply signals.
FIG. 2B illustrates a schematic diagram of a second common mode inductance filter for filtering ground signals.
Figure 3:
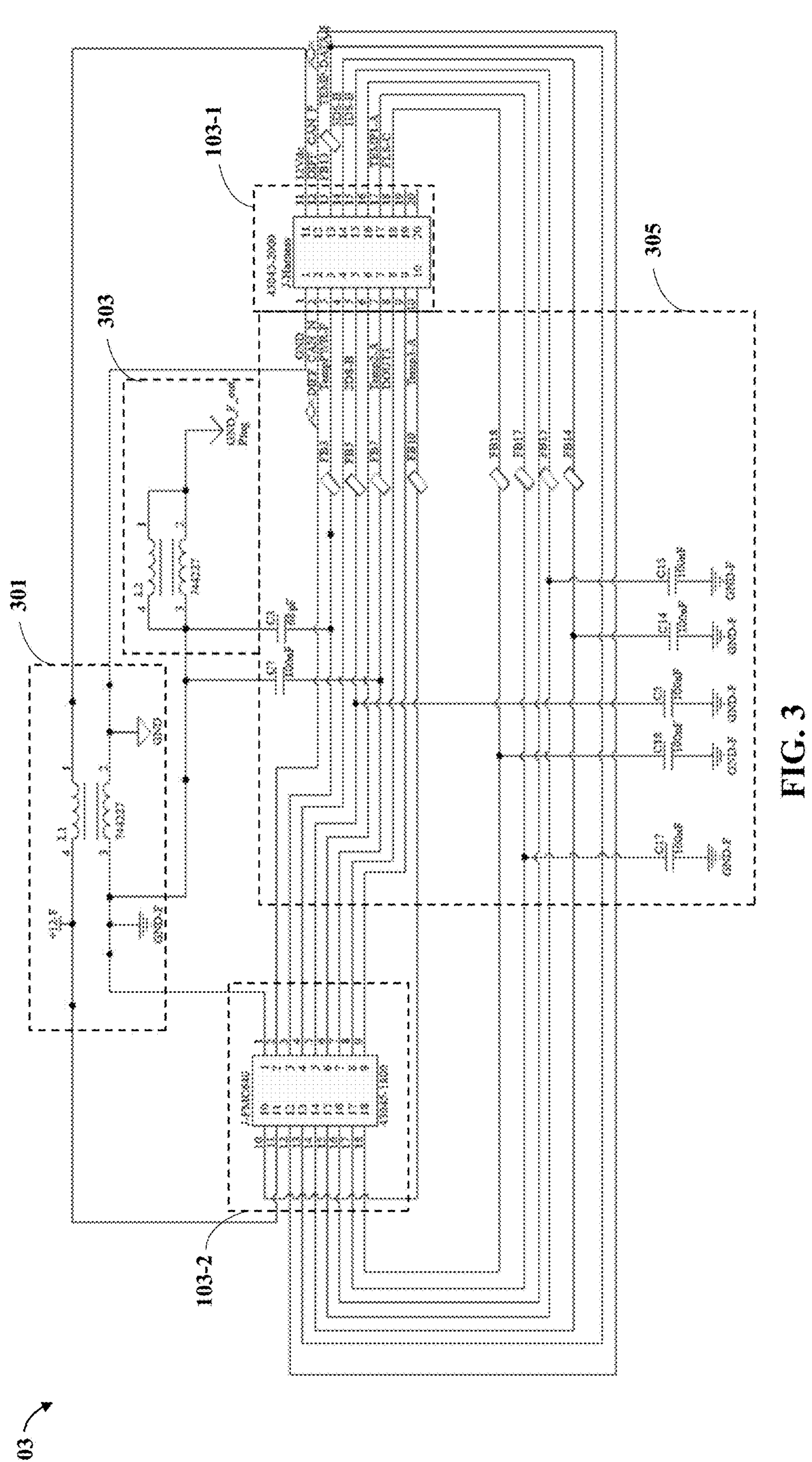
FIG. 3 illustrates a schematic diagram of an electromagnetic compatibility (EMC) filter.

FIG. 2A illustrates a schematic diagram of the first common mode inductance filter 200-1 for reducing the EMI generated due to the input power signal 115. As shown in FIG. 2A, the first common mode inductance filter 200-1 includes a common mode inductor L1. The common mode inductor L1 receives the input power signal 115 between terminals 1 and 2 of the common mode inductor L1. The input power signal 115 includes a line voltage signal 203 of 12V DC, which may be applied at terminal 1 of the common mode inductor L1. Further, a ground voltage signal 201 corresponding to the line voltage signal 203 of 12 V may be applied at terminal 2 of the common mode inductor L1.

The common mode inductor L1 is made up of two inductors wound on a common magnetic core, with both inductors connected in series with the input and output lines corresponding to the input power signal 115. The common mode inductor L1 filters the EMI noise that may be present at the input terminal corresponding to the input power signal 115. The EMI noise flows through both inductors in the same direction. The flow of the EMI noise in the same direction may generate a magnetic field that may oppose the EMI noise. The generated magnetic field helps in the reduction of the EMI noise through the common mode inductor L1.

The common mode inductor L1 further filters the line voltage signal 203 and outputs a filtered 12V DC output signal 205 at terminal 4 of the common mode inductor L1. A filtered ground signal 207 may be received at terminal 3 of the common mode inductor L1.

Further, the EMI and the external EMC noises have a significant impact on a reference ground signal 209 of devices connected to the fleet management apparatus 101. The reference ground signal 209 provides a reference voltage for the one or more input signals received from the plurality of sensors and serves as a return path for the current. The reference voltage becomes unstable when the EMI may be present in the reference ground signal 209 of the electronic components associated with the fleet management apparatus 101. The instability of the reference voltage results in distorted signals and increased noise levels. In addition, the presence of the EMI in the reference ground signal 209 also leads to ground loops, which occur when there are multiple ground paths in the EMC filter's circuit. The ground loops may cause the current to flow through the reference ground signal 209, which may create noise and interfere with the functional operability of the fleet management apparatus 101.

In view of the aforementioned issues due to the ground loops, FIG. 2B illustrates a schematic diagram of a second common mode inductance filter 200-2 for reducing the EMI generated due to the reference ground signal.

As shown in FIG. 2B, the second common mode inductance filter 200-2 includes a common mode inductor L2. The common mode inductor L2 is made up of two inductors wounded on a common magnetic core, with both inductors connected in series. Terminal 1 and terminal 2 of the common mode inductor L2 are connected to each other and the reference ground signal 209 may be inputted to commonly connected terminals. Terminals 3 and 4 of the common mode inductor L2 are also connected to each other. The terminals 3 and 4 of the common mode inductor L2 are configured to output the filtered ground signal 207. The common mode inductor L2 filters the EMI noise that may be present in the reference ground signal. When the EMI noise flows through both the inductors of the common mode inductor L2 in the same direction, a magnetic field may be created that may oppose the EMI noise. The created magnetic field reduces the EMI noise through the common mode inductor L2.

FIG. 3 illustrates a schematic diagram of the EMC filter 103. The first connection port 103-1 of the EMC filter 103 is configured to receive the one or more input signals from the plurality of sensors and the input power signal 115. The input power signal 115 refers to a power supply signal for the fleet management apparatus 101. The first connection port 103-1 may be, for example, a 20-pin connection port as shown in FIG. 3. In a non-limiting example, differential signals of the CAN bus 111, for example, CAN High (CAN H) and CAN Low (CAN L) may be received at pin-2 and pin 12 of the first connection port 103-1.

The first filter stage 301 is configured to filter the received input power signal 115. The first filter stage 301 is further configured to output a filtered 12V DC output signal 205 for the fleet management apparatus 101. In a non-limiting example, an inductance value of each inductor of the first filter stage 301 may be 51 μH. Further, the inductance value of each inductor of the first filter stage 301 may have a tolerance of +/−30% at a frequency of 1 Khz. Thus, the inductance value of each inductor of the first filter stage 301 may be varied in a range of 35.7 μH to 66.3 μH. For example, the first filter stage 301 receives the line voltage signal 203 of 12V DC via pin-11 of the first connection port 103-1 and the ground voltage signal 201 via pin-1 of the first connection port 103-1. The first filter stage 301 outputs the filtered 12V DC signal via pin-11 of the second connection port 103-2.

The second filter stage 303 is configured to filter the reference ground signal 209 of the EMC filter 103. In a non-limiting example, the second filter stage 303 may filter a plurality of reference ground signals 209 of the EMC filter 103. The second filter stage 303 is configured to output the filtered ground signal 207. In a non-limiting example, an inductance value of each inductor of the second filter stage may be 51 H with the tolerance of +/−30% at the frequency of 1 Khz. Thus, the inductance value of each of the inductor of the second filter stage 303 may be varied in the range of 35.7 μH to 66.3 μH. For example, the second filter stage 303 filters the reference ground signal 209 and outputs the filtered ground signal 207 to pin-1 of the second connection port 103-2.

The first filter stage 301 and the second filter stage 303 provide various technical advantages, for example, the configuration of each of the first filter stage 301 and the second filter stage 303 does not affect a signal rise time because of the magnetic field compensation across the first common mode inductance filter 200-1 and the second common mode inductance filter 200-2. For example, the signal rise time means a time taken by the signal to transit from a low state to a high state, or vice versa. Since, each of the first common mode inductance filter 200-1 and the second common mode inductance filter 200-2 have windings that are magnetically coupled, the influence of the wanted signal is restricted. Further, the configuration of each of the first common mode inductance filter 200-1 and the second common mode inductance filter 200-2 restricts an occurrence of the saturation from the DC current because of the magnetic coupling.

The third filter stage 305 includes a plurality of ferrite beads (FB3, FB5, FB7, FB10, FB13, FB14, FB17, FB18) and a plurality of capacitors (C3, C 5, C7, C10, C13, C14, C17, C18). The third filter stage 305 receives one or more input signals from the first connection port 103-1. Further, the third filter stage 305 outputs filtered signals of the received one or more input signals to the second connection port 103-2. In particular, the third filter stage 305 filters the received one or more input signals to remove EMC noises from the received one or more input signals. More particularly, the third filter stage 305 reduces the amount of the EMI picked up by the plurality of sensors.

Each ferrite bead of the plurality of ferrite beads of the third filter stage 305 is a passive component made of a ceramic material containing iron oxide. Each ferrite bead of the plurality of ferrite beads is configured to filter out high-frequency noise and interference while allowing lower frequency signals to pass through. In a non-limiting example, each ferrite bead of the plurality of ferrite beads is configured to filter out the EMI in the range of 1 MHz to 1 GHz.

The plurality of capacitors of the third filter stage 305 is used in combination with the plurality of ferrite beads of the third filter stage 305 for filtering the one or more input signals received from the plurality of sensors. The plurality of ferrite beads is placed in series with respect to a signal line carrying the received one or more input signals. The corresponding capacitors of the plurality of capacitors are placed in parallel to the signal line carrying the received one or more input signals. Each combination of a corresponding ferrite bead of the plurality of ferrite beads and a corresponding capacitor of the plurality of capacitors filters out the high-frequency noise and the EMI while allowing the sensor signal to pass through the third filter stage 305 with minimal distortion. In a non-limiting example, a resistance value of each ferrite bead of the plurality of ferrite beads may be 600Ω with a tolerance of +/−25% at a frequency of 100 MHz at 200 mA of rated current value. Thus, the resistance value of each ferrite bead of the plurality of ferrite beads may be varied in the range of 450Ω to 750Ω. Furthermore, in a non-limiting example, a capacitance value of each of the plurality of capacitors may be 68 pF or 100 nF with a tolerance of +/−5% and +/−10%, respectively. Thus, the capacitance value of each of the plurality of capacitors may be varied in a range of 64.6 pF to 71.4 pF and in a range of 90 nF to 110 nF, respectively. Those skilled in the art will appreciate that one or more examples of the received one or more input signals are not limiting and are not intended to limit the scope of the invention.

In a non-limiting example, the CAN High and CAN Low signals are filtered using a combination of (FB2, C2) and (FB12, C12), respectively. The filtered signals are outputted at pin-2 and pin-12 of the second connection port.

Further, the second connection port 103-2 is configured to output the filtered one or more input signals and the filtered input power signal to the fleet management apparatus 101.

Figure 4:
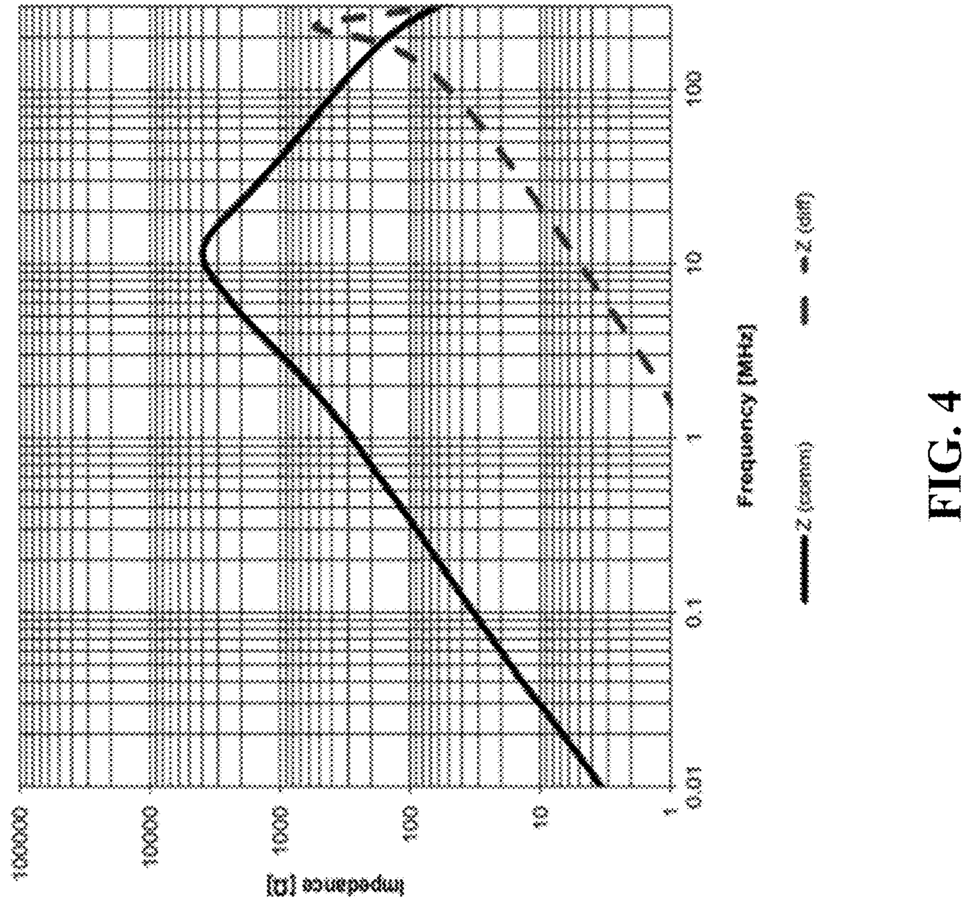
FIG. 4 illustrates a graphical representation of typical impedance characteristics of common mode inductance filters of FIGS. 2A and 2B.

FIG. 4 illustrates a graphical representation of typical impedance characteristics of the common mode inductors of the first common mode inductance filter 200-1 and the second common mode inductance filter 200-2 of FIGS. 2A and 2B. In particular, FIG. 4 illustrates an impedance characteristics curve of the common mode inductors as a variation of common mode impedance with respect to an operating frequency of the common mode inductors. The common mode inductors exhibit an inductive characteristic up to a resonance frequency. The inductive characteristics mean that the impedance of the common mode inductors increases as the frequency rises. The common mode inductors exhibit a capacitive characteristic beyond the resonance frequency. The capacitive characteristics means the impedance of the common mode inductors decreases as the frequency rises. At all the frequencies higher than the resonance frequency, the common mode inductors work as a capacitive filter.

As would be apparent to a person in the art, various working modifications may be made to the method in order to implement the inventive concept as taught herein.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. An electromagnetic compatibility (EMC) filter, comprising:

a first connection port configured to receive one or more input signals from a plurality of sensors and an input power signal, the one or more input signals comprise Fuel Level Sensor Circuit (FLS-C) signals;

a first filter stage configured to filter the received input power signal;

a second filter stage configured to filter one or more ground output signals of the EMC filter;

a third filter stage that includes a plurality of ferrite beads and a plurality of capacitors, wherein the third filter stage is configured to filter the received one or more input signals to remove EMC noises from the received one or more input signals; and a second connection port configured to output the filtered one or more input signals and the filtered input power signal to a fleet management apparatus.

2. The EMC filter of claim 1, wherein each of the first filter stage and the second filter stage is configured in a common mode inductance configuration.

3. The EMC filter of claim 2, wherein an inductance value of each of the first filter stage and the second filter stage in the common mode inductance configuration is 51 H with a tolerance of +/−30% at a frequency of 1 Khz.

4. The EMC filter claim 1, wherein the received one or more input signals include Controller Area Network (CAN) signals, output signals of one or more temperature sensors, a plurality of digital signals, power supply voltage or current signals associated with the one or more temperature sensors.

5. The EMC filter of claim 4, wherein:

the third filter stage is further configured to filter the power supply voltage or the current signals using a first ferrite bead of the plurality of ferrite beads and a first capacitor of the plurality of capacitors, and a capacitance value of the first capacitor is 68 pF with a tolerance of +/−5%.

6. The EMC filter of claim 4, wherein:

the third filter stage is further configured to filter the output signals of the one or more temperature sensors using a second ferrite bead of the plurality of ferrite beads and a second capacitor of the plurality of capacitors, and a capacitance value of the second capacitor is one of 68 pF with the tolerance of +/−5% or 100 nF with a tolerance of +/−10%.

7. The EMC filter of claim 4, wherein:

the third filter stage is further configured to filter the plurality of digital signals using a third ferrite bead of the plurality of ferrite beads and a third capacitor of the plurality of capacitors, and a capacitance value of the third capacitor is 100 nF with the tolerance of +/−10%.

8. The EMC filter of claim 1, wherein:

the third filter stage is further configured to filter the FLS-C signals using a fourth ferrite bead of the plurality of ferrite beads and a fourth capacitor of the plurality of capacitors, and a capacitance value of the fourth capacitor is 100 nF with the tolerance of +/−10%.

9. The EMC filter of claim 1, wherein a resistance value of each ferrite bead of the plurality of ferrite beads is 60052 with a tolerance of +/−25% at a frequency of 100 MHz.

10. A fleet management system, comprising:

a refrigeration unit including a plurality of sensors;

a fleet management module configured to control setting of the refrigeration unit; and an electromagnetic compatibility (EMC) filter disposed between the refrigeration unit and the fleet management module, wherein the EMC filter comprises:

a first connection port configured to receive one or more input signals from the plurality of sensors and an input power signal;

a first filter stage configured to filter the received input power signal;

a second filter stage configured to filter one or more ground output signals of the EMC filter;

a third filter stage that includes a plurality of ferrite beads and a plurality of capacitors, wherein the third filter stage is configured to filter the received one or more input signals to remove EMC noises from the received one or more input signals; and a second connection port configured to output the filtered one or more input signals and the filtered input power signal to the fleet management module, wherein the fleet management module is configured to control the setting of the refrigeration unit based on the filtered one or more input signals.

11. A refrigeration trailer, comprising:

a refrigeration unit including a plurality of sensors;

a fleet management module configured to control setting of the refrigeration unit; and an electromagnetic compatibility (EMC) filter according to claim 1 disposed between the refrigeration unit and the fleet management module, wherein the EMC filter comprises:

a first connection port configured to receive one or more input signals from the plurality of sensors and an input power signal;

a first filter stage configured to filter the received input power signal;

a second filter stage configured to filter one or more ground output signals of the EMC filter;

a third filter stage that includes a plurality of ferrite beads and a plurality of capacitors, wherein the third filter stage is configured to filter the received one or more input signals to remove EMC noises from the received one or more input signals; and a second connection port configured to output the filtered one or more input signals and the filtered input power signal to the fleet management module, wherein the fleet management module is configured to control the setting of the refrigeration unit based on the filtered one or more input signals.

* * * * *